US010908593B1

(12) United States Patent
Rizon et al.

(10) Patent No.: US 10,908,593 B1
(45) Date of Patent: Feb. 2, 2021

(54) SYSTEMS AND METHODS FOR FABRICATION OF A VOLUMETRIC MODULE

(71) Applicant: Factory OS, Inc., Vallejo, CA (US)

(72) Inventors: Edison Rizon, Concord, CA (US); Jordan Easterling, San Francisco, CA (US)

(73) Assignee: FACTORY OS, INC., Vallejo, CA (US)

( * ) Notice: Subject to any disclaimer, the term of this patent is extended or adjusted under 35 U.S.C. 154(b) by 0 days.

(21) Appl. No.: 16/932,973

(22) Filed: Jul. 20, 2020

Related U.S. Application Data

(60) Provisional application No. 63/035,927, filed on Jun. 8, 2020.

(51) Int. Cl.
*G05B 19/4155* (2006.01)
*E04G 11/20* (2006.01)

(52) U.S. Cl.
CPC ............ *G05B 19/4155* (2013.01); *G05B 2219/32019* (2013.01)

(58) Field of Classification Search
CPC .............. G05B 19/4155; G05B 2219/32019
See application file for complete search history.

(56) References Cited

U.S. PATENT DOCUMENTS

| | | | |
|---|---|---|---|
| 5,089,970 A | 2/1992 | Lee et al. | |
| 6,240,328 B1 | 5/2001 | LeLonde et al. | |
| 7,113,789 B1 * | 9/2006 | Boehmke | G06Q 10/06 455/446 |
| 7,552,203 B2 | 6/2009 | Giles et al. | |
| 8,549,439 B2 | 10/2013 | Howard | |
| 9,140,023 B2 * | 9/2015 | McCaffrey | E04B 1/34823 |
| 9,371,648 B1 * | 6/2016 | Tikhovskiy | E04B 5/21 |
| 9,525,976 B2 | 12/2016 | Dharwada et al. | |
| 10,227,785 B2 * | 3/2019 | McCaffrey | E04G 11/02 |
| 10,731,327 B2 * | 8/2020 | Berkowitz | E04H 3/00 |
| 2004/0044733 A1 | 3/2004 | Fan | |
| 2006/0075718 A1 | 4/2006 | Borne et al. | |
| 2010/0125790 A1 | 5/2010 | Erskin | |

(Continued)

FOREIGN PATENT DOCUMENTS

WO 0055771 9/2000

*Primary Examiner* — Abdelmoniem I Elamin
(74) *Attorney, Agent, or Firm* — Bryan Cave Leighton Paisner LLP

(57) ABSTRACT

A system and method are provided for instructing users on the fabrication of a volumetric module. Aspects thereof comprise receiving project documents related to fabrication of a volumetric module, generating fabrication information for instructing users on fabrication of the volumetric module, storing the fabrication information, creating a mesh network of actionable links based on parametric relationships comprising an intuitive, navigable mapping for accessing the stored fabrication information, providing a user interface to interact with the intuitive, navigable mapping to perform any one or more of (i) accessing the fabrication information to perform one or more steps in the fabrication of the volumetric module, and (ii) providing feedback regarding the fabrication information to facilitate review and updating to the fabrication information, and continuously updating the stored fabrication information and mesh network.

18 Claims, 6 Drawing Sheets

(56) References Cited

U.S. PATENT DOCUMENTS

| | | |
|---|---|---|
| 2012/0308984 A1 | 12/2012 | Rataul |
| 2013/0159833 A1 | 6/2013 | Look et al. |
| 2013/0205257 A1 | 8/2013 | Albright |
| 2014/0137017 A1 | 5/2014 | Sharma et al. |
| 2014/0163931 A1 | 6/2014 | Snyder et al. |
| 2014/0337286 A1 | 11/2014 | Omansky et al. |
| 2015/0030712 A1* | 1/2015 | McCaffrey .......... E04B 1/34823 425/63 |
| 2016/0032601 A1* | 2/2016 | McCaffrey ................ B28B 7/08 264/34 |
| 2016/0202692 A1 | 7/2016 | Patel et al. |
| 2018/0268336 A1 | 9/2018 | Tierney et al. |
| 2018/0276319 A1 | 9/2018 | Tierney et al. |
| 2019/0032328 A1 | 1/2019 | Miller |
| 2019/0040623 A1 | 2/2019 | Miller |
| 2019/0073388 A1 | 3/2019 | Desmarets |
| 2019/0220759 A1 | 7/2019 | Tierney |
| 2019/0302737 A1 | 10/2019 | De Wit et al. |

* cited by examiner

400

401 – Receiving project documents related to fabrication of a volumetric module, the project documents comprising one or more of design data, drawings, building information modeling (BIM) data, project specifications, vendor data, installation instructions, and part make and model information;

402 – Generating fabrication information, in relation to the received project documents, for instructing users on fabrication of the volumetric module, the fabrication information comprising one or more of fabrication drawings, material information, fabrication sequence instructions, quality assurance and/or quality control processes, and scheduling data, the fabrication information comprising multiple different data formats;

403 – Storing the fabrication information comprising the multiple different data formats for access in instructing fabrication of the volumetric module;

404 – Creating a mesh network of actionable links based on parametric relationships comprising an intuitive, navigable mapping for accessing the stored fabrication information, the intuitive mapping being based on any one or more of (1) a stage of fabrication of the volumetric module, (2) a type of fabrication work to be performed, and (3) a type of user accessing the fabrication information;

405 – Providing a user interface accessible by any one or more of a plurality of users to interact with the intuitive, navigable mapping to perform any one or more of (i) accessing the fabrication information to perform one or more steps in the fabrication of the volumetric module, and (ii) providing feedback regarding the fabrication information to facilitate review and updating to the fabrication information;

406 – Continuously updating the stored fabrication information and mesh network based on any one or more of (i) newly received or updated project documents and/or fabrication information, and (ii) feedback received by one or more users regarding the fabrication information.

FIG. 4

SYSTEMS AND METHODS FOR FABRICATION OF A VOLUMETRIC MODULE

CROSS-REFERENCE TO RELATED APPLICATIONS

The present application claims priority to provisional application 63/035,927 filed on Jun. 8, 2020, which is hereby incorporated by reference in their entireties herein.

TECHNICAL FIELD

This disclosure relates generally to systems and methods for the fabrication of a volumetric module, such as systems and methods for providing intuitive fabrication information to multiple different users at various different stages of and/or roles in, of fabrication of the volumetric module.

BACKGROUND

Volumetric modular construction refers to a construction technology and process in which at least certain processes are located in an "off-site" factory environment. The "off-site" terminology references the contrast to conventional construction in which the entirety of the building is constructed on its permanent site. In contrast, in many volumetric modular construction processes, most or even all of the "vertical" sections (e.g., apartment or other units and rooms) of a volumetric building are constructed in the factory, and shipped to the permanent site for building assembly. Certain "horizontal" sections (e.g., foundation, parking, etc.) may be built conventionally on the permanent site, and can be integrated with "vertical" sections constructed off-site. Other building elements (e.g., exterior siding, elevators or stairs) can also be built either off- or on-site. Generally, volumetric modular construction can entail thousands of materials delivered to the factory location for assembly during the fabrication process. The fabrication of a volumetric module entails thousands of manual and automated processes in an industrial designed assembly line setting. The labor component involves a multitude of construction disciplines (e.g., framers, electricians, plumbers, etc.). Instructions for materials and assembly are specific to each discipline, requiring a very precise and complex sequence and coordination among all the disciplines in the factory setting.

Volumetric modular construction is increasingly in high demand for construction projects such a multifamily apartments, hotels, schools, and other construction market segments in relatively high-density and high-cost labor markets. The advantages of volumetric modular construction include the ability to assemble portions of the final building, often referred to as modular units or volumetric modules, at an off-site factory location, with the completed volumetric modules transported to the building site and assembled together to form the final project. Since the assembly of the volumetric modules occurs off-site, all aspects of the assembly including mechanical, structural, electrical, plumbing, etc., can be carefully coordinated and controlled for each volumetric module, to increase the efficiency of module assembly, and to control the quality and build of the final product. Furthermore, multi-unit construction typically requires the coordination of multiple professional and trade construction disciplines such as architects, engineers, contractors, electricians, plumbers, cabinetmakers, building materials suppliers, etc. One key advantage of shifting conventional on-site construction of multifamily units to an off-site volumetric modular construction in a factory setting is the enhanced efficiency in hiring and coordinating of these disciplines within one company, thereby enhancing control over all disciplines and processes for the module fabrication and design.

While off-site assembly of volumetric modules provides certain advantages, certain assembly practices can retain some of the inefficiencies of more conventional, on-site building construction. For example, conventional building construction may involve the creation of detailed and complex project documents, which is typically hundreds of design sheets and multi-volume documents (or an electronic version thereof) based at least generally on the hundreds to thousands of architectural project plans and specifications sheets for the multifamily building, and that provides detailed and extensive information needed for assembling the building. Such detailed assembly information can include, for example, the sizes and specifications of parts used in the assembly of walls, windows, doors, electrical components, plumbing, etc., the dimensions and physical locations of component parts, certain plan views showing the interrelation of different components and portions of the building, environmental and health and safety requirements, etc. However, the navigation of such complex specifications and drawings (e.g. architectural, MEP and structural drawings) by those seeking to perform even a relatively confined role in the building construction can be an unnecessarily arduous task. For example, to build a specific wall, a person in a structural build role would be required to search through all of the architectural drawing sheets to find pertinent information on the wall to be built, cross-reference the structural drawings sheets, and then further find any pages in either drawing set with details and requirements on any ancillary components (e.g. beams, supports, insulation) that may interface with the wall, position and type of windows, project-specific requirements outlined in project manual pages, and any added information that may be needed to secure all components and arrangements thereof for the wall assembly.

Furthermore, the relatively static nature of such information in the project documents (project manuals and drawings) may typically provide only limited information to any person in a specific build role about other aspects of the fabrication that might be important for the efficiency and accuracy of the fabrication. For example, a person in a structural build role may not be able to readily locate information about, or otherwise be notified of, features relevant to coordination or interrelation with other fabrication aspects, such as electrical and/or plumbing aspects. The burden of navigating such conventional fabrication documents, and related project documents, can become further exacerbated when multiplied over the numerous different persons that may be involved in the multitude of different build roles required for a fabrication project, resulting in wasted time and inevitable error in the assembly process. Project information is also often modified via requests for information (RFIs), architect's supplemental instructions (ASIs), drawing revisions, and other means, resulting in difficulty referencing the most current, governing information. Conventional project documents also typically do not allow for ready feedback from end users to designers, architects, etc., meaning that errors in the project documentation may not be addressed in a timely manner, and any improvements to methods of assembly cannot readily be incorporated in a cohesive manner. Accordingly, there is a significant need for improving the information format and flow for the multitude of disciplines that use the plans in different fabrication roles for the fabrication of volumetric modules. There is a further need for providing improved build specifications and instructions to persons involved in fabricating volumetric modules that are intuitive and enhance the ease, efficiency, and accuracy of assembly.

BRIEF DESCRIPTION OF THE DRAWINGS

To facilitate further description of the embodiments, the following drawings are provided in which:

FIG. 4 illustrates a flowchart for a method, according to certain embodiments;

Figure 1:
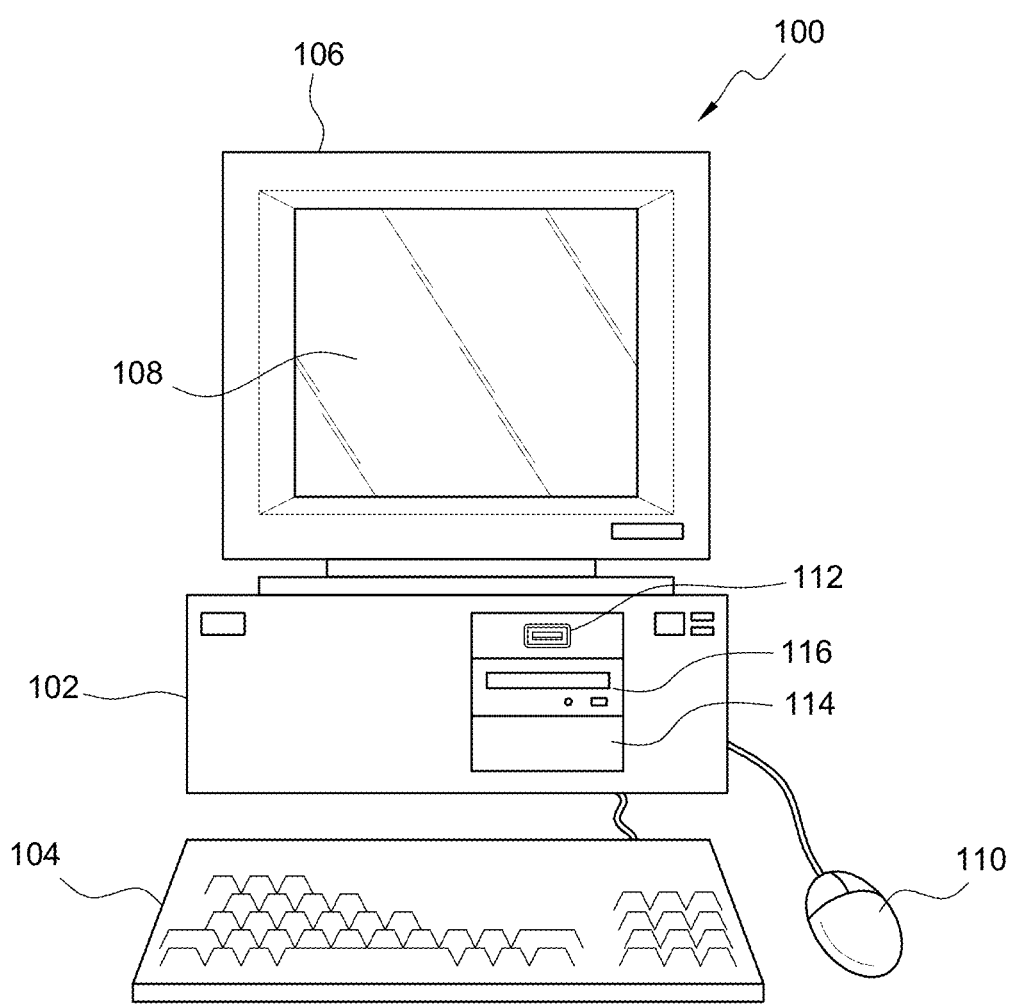
FIG. 1 illustrates a front elevational view of a computer system that is suitable for implementing various embodiments of the systems disclosed in FIGS. 3, 5 and 6.

For simplicity and clarity of illustration, the drawing figures illustrate the general manner of construction, and descriptions and details of well-known features and techniques may be omitted to avoid unnecessarily obscuring the present disclosure. Additionally, elements in the drawing figures are not necessarily drawn to scale. For example, the dimensions of some of the elements in the figures may be exaggerated relative to other elements to help improve understanding of embodiments of the present disclosure. The same reference numerals in different figures denote the same elements.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments described herein are, for example, capable of operation in sequences other than those illustrated or otherwise described herein. Furthermore, the terms "include," and "have," and any variations thereof, are intended to cover a non-exclusive inclusion, such that a process, method, system, article, device, or apparatus that comprises a list of elements is not necessarily limited to those elements, but may include other elements not expressly listed or inherent to such process, method, system, article, device, or apparatus.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the apparatus, methods, and/or articles of manufacture described herein are, for example, capable of operation in other orientations than those illustrated or otherwise described herein.

The terms "couple," "coupled," "couples," "coupling," and the like should be broadly understood and refer to connecting two or more elements mechanically and/or otherwise. Two or more electrical elements may be electrically coupled together, but not be mechanically or otherwise coupled together. Coupling may be for any length of time, e.g., permanent or semi-permanent or only for an instant. "Electrical coupling" and the like should be broadly understood and include electrical coupling of all types. The absence of the word "removably," "removable," and the like near the word "coupled," and the like does not mean that the coupling, etc. in question is or is not removable.

As defined herein, two or more elements are "integral" if they are comprised of the same piece of material. As defined herein, two or more elements are "non-integral" if each is comprised of a different piece of material.

As defined herein, "real-time" can, in some embodiments, be defined with respect to operations carried out as soon as practically possible upon occurrence of a triggering event. A triggering event can include receipt of data necessary to execute a task or to otherwise process information. Because of delays inherent in transmission and/or in computing speeds, the term "real time" encompasses operations that occur in "near" real time or somewhat delayed from a triggering event. In a number of embodiments, "real time" can mean real time less a time delay for processing (e.g., determining) and/or transmitting data. The particular time delay can vary depending on the type and/or amount of the data, the processing speeds of the hardware, the transmission capability of the communication hardware, the transmission distance, etc. However, in many embodiments, the time delay can be less than approximately one second, two seconds, five seconds, or ten seconds.

As defined herein, "approximately" can, in some embodiments, mean within plus or minus ten percent of the stated value. In other embodiments, "approximately" can mean within plus or minus five percent of the stated value. In further embodiments, "approximately" can mean within plus or minus three percent of the stated value. In yet other embodiments, "approximately" can mean within plus or minus one percent of the stated value.

DESCRIPTION OF EXAMPLES OF EMBODIMENTS

A number of embodiments can include a system. The system can include one or more processors and one or more non-transitory computer-readable storage devices storing computing instructions. The computing instructions can be configured to run on the one or more processors and perform acts of: (a) receiving project documents related to fabrication of a volumetric module, the project documents comprising one or more of design data, drawings, building information modeling (BIM) data, project specifications, vendor data, installation instructions, and component make and model information; (b) generating fabrication information, in relation to the received project documents, for instructing users on fabrication of the volumetric module, the fabrication information comprising one or more of fabrication drawings, material information, fabrication sequence instructions, quality assurance and/or quality control processes, and scheduling data, the fabrication information comprising multiple different data formats; (c) storing the fabrication information comprising the multiple different data formats for access in instructing fabrication of the volumetric module; (d) creating a mesh network of actionable links based on parametric relationships comprising an intuitive, navigable mapping for accessing the stored fabrication information, the intuitive mapping being based on any one or more of (1) a stage of fabrication of the volumetric module, (2) a type of fabrication work to be performed, and (3) a type of user accessing the fabrication information; (e) providing a user interface accessible by any one or more of a plurality of users to interact with the intuitive, navigable mapping to perform any one or more of (i) accessing the fabrication information to perform one or more steps in the fabrication of the volumetric module, and (ii) providing feedback regarding the fabrication information to facilitate review and updating to the fabrication information; and (f) continuously updating the stored fabrication information and mesh network based on any one or more of (i) newly received or updated project documents and/or fabrication information, and (ii) feedback received by one or more users regarding the fabrication information.

Various embodiments include a method. The method can be implemented via execution of computing instructions configured to run at one or more processors and configured to be stored at non-transitory computer-readable media. The method can comprise (a) receiving project documents related to fabrication of a volumetric module, the project documents comprising one or more of design data, drawings, building information modeling (BIM) data, project specifications, vendor data, installation instructions, and component make and model information; (b) generating fabrication information, in relation to the received project documents, for instructing users on fabrication of the volumetric module, the fabrication information comprising one or more of fabrication drawings, material information, fabrication sequence instructions, quality assurance and/or quality control processes, and scheduling data, the fabrication information comprising multiple different data formats; (c) storing the fabrication information comprising the multiple different data formats for access in instructing fabrication of the volumetric module; (d) creating a mesh network of actionable links based on parametric relationships comprising an intuitive, navigable mapping for accessing the stored fabrication information, the intuitive mapping being based on any one or more of (1) a stage of fabrication of the volumetric module, (2) a type of fabrication work to be performed, and (3) a type of user accessing the fabrication information; (e) providing a user interface accessible by any one or more of a plurality of users to interact with the intuitive, navigable mapping to perform any one or more of (i) accessing the fabrication information to perform one or more steps in the fabrication of the volumetric module, and (ii) providing feedback regarding the fabrication information to facilitate review and updating to the fabrication information; and (f) continuously updating the stored fabrication information and mesh network based on any one or more of (i) newly received or updated project documents and/or fabrication information, and (ii) feedback received by one or more users regarding the fabrication information.

According to certain embodiments, volumetric modular construction practices can involve constructing a building by assembling a plurality of volumetric modules and/or sub-units of the building off-site, which volumetric modules can be transported to the building construction site post-fabrication to serve as the building blocks that make up the final building. A given construction project can involve one or a plurality of volumetric modules, where the volumetric modules can comprise distinct subunits of the building, such as studio, one, two, or three bedroom modules for an apartment complex, or some combination of rooms and/or structures that can be used in a repeat fashion in the building structure.

In certain embodiments, the assembly of the volumetric modular construction can involve an assembly-line type process, whereby certain portions of each volumetric module are assembled in a specific order, and multiple different assembly stations, according to the type of volumetric module being assembled. The assembly can comprise multiple different aspects and/or stages of fabrication, such as framing and floor coverings, plumbing, electrical, insulation, fire-proofing, acoustical, environmental and safety, roofing and finishing, and other aspects, each of which can be performed at a same or different assembly station and by the same or different persons in various assembly roles. According to certain aspects, the careful coordination of the assembly work is important to efficiently and accurately fabricate the volumetric modules in timely and cost-effective manner.

According to aspects herein, the persons performing the various assembly roles and/or disciplines can be provided with an improved and intuitive interface to access fabrication information on assembly of one or more components and/or structures of the volumetric module, to increase the efficiency and accuracy of volumetric modular assembly processes. According to further aspects herein, the system may allow for continuous updating of the fabrication information, and the interface may further allow for end users to provide feedback on the fabrication information, which can facilitate continuous improvement of the fabrication design documents and assembly process. Aspects herein may thus provide for a streamlined and accessible easy to use system and process that allows for ready access to items of information most pertinent to persons in each assembly role, without requiring specialized technical skill or significant training for such access. Furthermore, aspects herein also provide for dynamic updating of the fabrication information to increase the efficiency and coordination of use of the information.

Figure 6:
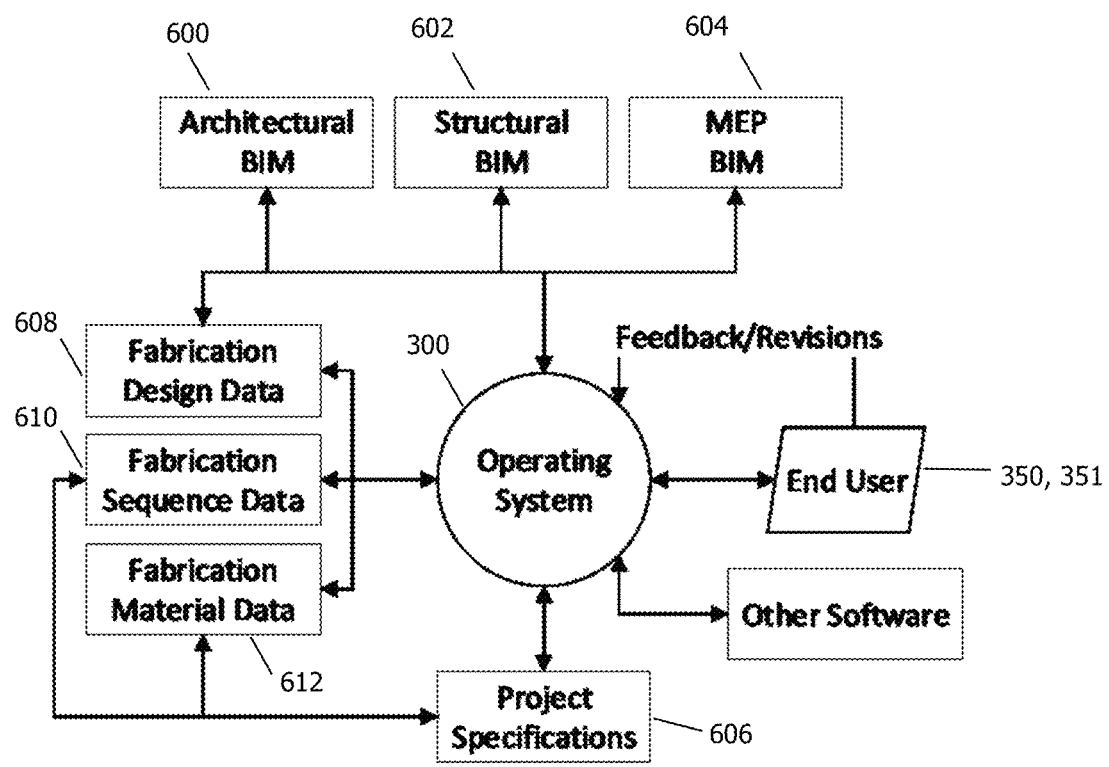
FIG. 6 illustrates a flowchart for a method, according to certain embodiments.

Referring to FIG. 6, an embodiment is shown of a process work-flow for an assembly instruction system 300 that is capable of providing fabrication information to a user for the assembly of a volumetric module. The system can allow a user to access, for example, fabrication information such as installation instructions and sequencing information for installation. The system can additionally allow for review and access to revisions to a fabrication plan, formatting, and data integrations via the starting page. The user of the system may be, for example, a designer and/or architect involved in preparing plans and/or instructions for assembly, and/or may be a person tasked with performing an assembly step in the fabrication of the volumetric module. Accordingly, the system may provide for access to a plurality of different users involved in different aspects of the assembly process.

Referring to the embodiment shown in FIG. 6, the process flow can receive project documents including, for example, one or more of architectural building information modeling information (BIM) 600, structural BIM 602, and mechanical/electrical/plumbing BIM 604, as well as project specifications 606, and other project documents. According to certain aspects, the project documents may be received from a third party, such as an architect, or may be at least partly generated "in-house" by the fabricator's architect or engineer. The information from the project documents can be incorporated with and used to generate further fabrication information, such as fabrication design data 608, fabrication sequence data 610, and fabrication material data 612. The fabrication information can, in certain embodiments, include further detail and specificity with respect to assembly of the volumetric module, to assist an assembly person in assembly of the volumetric module, as opposed to the typically more high-level plans embodied by the project documents. For example, the fabrication information can provide sequence information that instructs on a specific assembly sequence that can be used to assemble a structure shown in an architectural drawing, and/or can provide information on specific materials to be used for the structure, or other specific design information for the structure. In certain embodiments, the integrated fabrication information can be coupled with referenced project documentation, which can be accessed via a starting page of the system. The system can be contained in a cloud platform that allows communication to a plurality of end users 350, 351, and optionally other software, both related to fabrication and other operational functions, to provide information regarding fabrication and assembly to the user, for example for fabrication of certain parts and/or components of the volumetric module. Examples of cloud platforms that can be used with the system can include, for example, Autodesk BIM360, although other commercially cloud platforms and/or proprietary cloud platforms can also be used. In the embodiment as shown, the process flow further accepts feedback and/or revisions from end users 350, 351, which may for example be feedback on instructions for assembly and/or revisions to the instructions, depending on a role of the end user accessing the system. As shown in the process flow, the feedback and/or revisions can be propagated back to any of the sources of assembly information, such as the fabrication design data, fabrication sequence data, fabrication material data, architectural BIM, structural BIM and/or MEP BIM, to provide continuous updates thereto. Further details of the process flow, and systems and method for providing assembly instructions are provided in more detail with reference to the embodiments described below.

Figure 2:
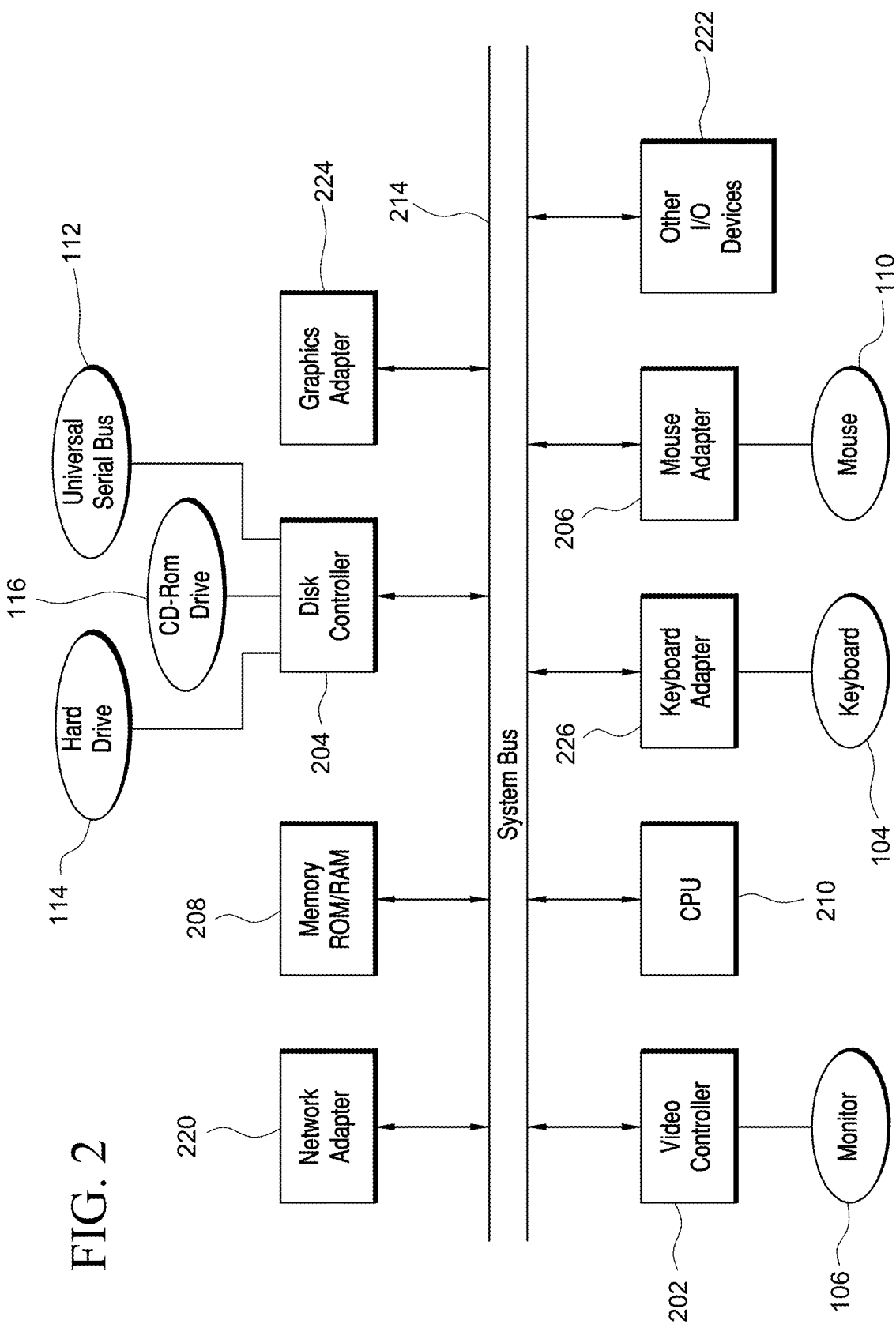
FIG. 2 illustrates a representative block diagram of an example of the elements included in the circuit boards inside a chassis of the computer system of FIG. 1.

Turning to the drawings, FIG. 1 illustrates an exemplary embodiment of a computer system 100, all of which or a portion of which can be suitable for (i) implementing part or all of one or more embodiments of the techniques, methods, and systems and/or (ii) implementing and/or operating part or all of one or more embodiments of the memory storage modules described herein. As an example, a different or separate one of a chassis 102 (and its internal components) can be suitable for implementing part or all of one or more embodiments of the techniques, methods, and/or systems described herein. Furthermore, one or more elements of computer system 100 (e.g., a monitor 106, a keyboard 104, and/or a mouse 110, etc.) also can be appropriate for implementing part or all of one or more embodiments of the techniques, methods, and/or systems described herein. Computer system 100 can comprise chassis 102 containing one or more circuit boards (not shown), a Universal Serial Bus (USB) port 112, a Compact Disc Read-Only Memory (CD-ROM) and/or Digital Video Disc (DVD) drive 116, and a hard drive 114. A representative block diagram of the elements included on the circuit boards inside chassis 102 is shown in FIG. 2. A central processing unit (CPU) 210 in FIG. 2 is coupled to a system bus 214 in FIG. 2. In various embodiments, the architecture of CPU 210 can be compliant with any of a variety of commercially distributed architecture families.

Continuing with FIG. 2, system bus 214 also is coupled to a memory storage unit 208, where memory storage unit 208 can comprise (i) non-volatile memory, such as, for example, read only memory (ROM) and/or (ii) volatile memory, such as, for example, random access memory (RAM). The non-volatile memory can be removable and/or non-removable non-volatile memory. Meanwhile, RAM can include dynamic RAM (DRAM), static RAM (SRAM), etc. Further, ROM can include mask-programmed ROM, programmable ROM (PROM), one-time programmable ROM (OTP), erasable programmable read-only memory (EPROM), electrically erasable programmable ROM (EEPROM) (e.g., electrically alterable ROM (EAROM) and/or flash memory), etc. In these or other embodiments, memory storage unit 208 can comprise (i) non-transitory memory and/or (ii) transitory memory.

In many embodiments, all or a portion of memory storage unit 208 can be referred to as memory storage module(s) and/or memory storage device(s). In various examples, portions of the memory storage module(s) of the various embodiments disclosed herein (e.g., portions of the non-volatile memory storage module(s)) can be encoded with a boot code sequence suitable for restoring computer system 100 (FIG. 1) to a functional state after a system reset. In addition, portions of the memory storage module(s) of the various embodiments disclosed herein (e.g., portions of the non-volatile memory storage module(s)) can comprise microcode such as a Basic Input-Output System (BIOS) operable with computer system 100 (FIG. 1). In the same or different examples, portions of the memory storage module(s) of the various embodiments disclosed herein (e.g., portions of the non-volatile memory storage module(s)) can comprise an operating system, which can be a software program that manages the hardware and software resources of a computer and/or a computer network. The BIOS can initialize and test components of computer system 100 (FIG. 1) and load the operating system. Meanwhile, the operating system can perform basic tasks such as, for example, controlling and allocating memory, prioritizing the processing of instructions, controlling input and output devices, facilitating networking, and managing files. Exemplary operating systems can comprise one of the following: (i) Microsoft® Windows® operating system (OS) by Microsoft Corp. of Redmond, Wash., United States of America, (ii) Mac® OS X by Apple Inc. of Cupertino, Calif., United States of America, (iii) UNIX® OS, and (iv) Linux® OS. Further exemplary operating systems can comprise one of the following: (i) the iOS® operating system by Apple Inc. of Cupertino, Calif., United States of America, (ii) the Blackberry® operating system by Research In Motion (RIM) of Waterloo, Ontario, Canada, (iii) the WebOS operating system by LG Electronics of Seoul, South Korea, (iv) the Android™ operating system developed by Google, of Mountain View, Calif., United States of America, (v) the Windows Mobile™ operating system by Microsoft Corp. of Redmond, Wash., United States of America, or (vi) the Symbian™ operating system by Accenture PLC of Dublin, Ireland.

As used herein, "processor" and/or "processing module" means any type of computational circuit, such as but not limited to a microprocessor, a microcontroller, a controller, a complex instruction set computing (CISC) microprocessor, a reduced instruction set computing (RISC) microprocessor, a very long instruction word (VLIW) microprocessor, a graphics processor, a digital signal processor, or any other type of processor or processing circuit capable of performing the desired functions. In some examples, the one or more processing modules of the various embodiments disclosed herein can comprise CPU 210.

Alternatively, or in addition to, the systems and procedures described herein can be implemented in hardware, or a combination of hardware, software, and/or firmware. For example, one or more application specific integrated circuits (ASICs) can be programmed to carry out one or more of the systems and procedures described herein. For example, one or more of the programs and/or executable program components described herein can be implemented in one or more ASICs. In many embodiments, an application specific integrated circuit (ASIC) can comprise one or more processors or microprocessors and/or memory blocks or memory storage.

In the depicted embodiment of FIG. 2, various I/O devices such as a disk controller 204, a graphics adapter 224, a video controller 202, a keyboard adapter 226, a mouse adapter 206, a network adapter 220, and other I/O devices 222 can be coupled to system bus 214. Keyboard adapter 226 and mouse adapter 206 are coupled to keyboard 104 (FIGS. 1-2) and mouse 110 (FIGS. 1-2), respectively, of computer system 100 (FIG. 1). While graphics adapter 224 and video controller 202 are indicated as distinct units in FIG. 2, video controller 202 can be integrated into graphics adapter 224, or vice versa in other embodiments. Video controller 202 is suitable for monitor 106 (FIGS. 1-2) to display images on a screen 108 (FIG. 1) of computer system 100 (FIG. 1). Disk controller 204 can control hard drive 114 (FIGS. 1-2), USB port 112 (FIGS. 1-2), and CD-ROM drive 116 (FIGS. 1-2). In other embodiments, distinct units can be used to control each of these devices separately.

Network adapter 220 can be suitable to connect computer system 100 (FIG. 1) to a computer network by wired communication (e.g., a wired network adapter) and/or wireless communication (e.g., a wireless network adapter). In some embodiments, network adapter 220 can be plugged or coupled to an expansion port (not shown) in computer system 100 (FIG. 1). In other embodiments, network adapter 220 can be built into computer system 100 (FIG. 1). For example, network adapter 220 can be built into computer system 100 (FIG. 1) by being integrated into the motherboard chipset (not shown), or implemented via one or more dedicated communication chips (not shown), connected through a PCI (peripheral component interconnector) or a PCI express bus of computer system 100 (FIG. 1) or USB port 112 (FIG. 1).

Returning now to FIG. 1, although many other components of computer system 100 are not shown, such components and their interconnection are well known to those of ordinary skill in the art. Accordingly, further details concerning the construction and composition of computer system 100 and the circuit boards inside chassis 102 are not discussed herein.

Meanwhile, when computer system 100 is running, program instructions (e.g., computer instructions) stored on one or more of the memory storage module(s) of the various embodiments disclosed herein can be executed by CPU 210 (FIG. 2). At least a portion of the program instructions, stored on these devices, can be suitable for carrying out at least part of the techniques and methods described herein.

Further, although computer system 100 is illustrated as a desktop computer in FIG. 1, there can be examples where computer system 100 may take a different form factor while still having functional elements similar to those described for computer system 100. In some embodiments, computer system 100 may comprise a single computer, a single server, or a cluster or collection of computers or servers, or a cloud of computers or servers. Typically, a cluster or collection of servers can be used when the demand on computer system 100 exceeds the reasonable capability of a single server or computer. In certain embodiments, computer system 100 may comprise a portable computer, such as a laptop computer. In certain other embodiments, computer system 100 may comprise a mobile electronic device, such as a smartphone. In certain additional embodiments, computer system 100 may comprise an embedded system.

Figure 3:
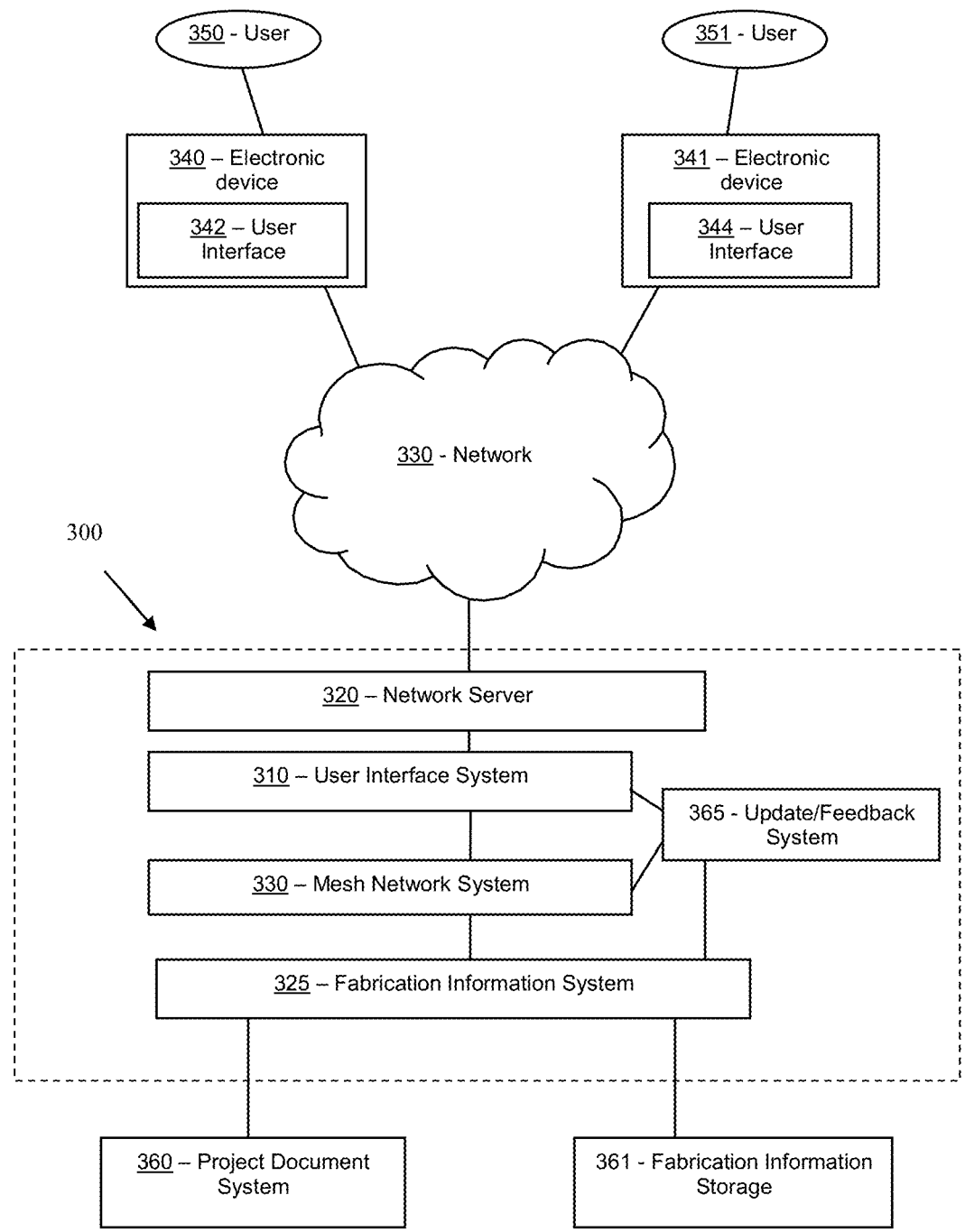
FIG. 3 illustrates a representative block diagram of a system, according to an embodiment.

Turning ahead in the drawings, FIG. 3 illustrates a block diagram of a system 300 that can be employed for systems and method for prediction of item quantity as described in greater detail below. System 300 is merely exemplary and embodiments of the system are not limited to the embodiments presented herein. System 300 can be employed in many different embodiments or examples not specifically depicted or described herein. In some embodiments, certain elements or modules of system 300 can perform various procedures, processes, and a fabrication information system 325, in communication with a project document system 360 and fabrication information storage 361. The network server 320, user interface system 310, update/feedback system 365, mesh network system 330, and fabrication information system 325, can each be a computer system, such as computer system 100 (FIG. 1), as described above, and can each be a single computer, a single server, or a cluster or collection of computers or servers, or a cloud of computers or servers. The user interface system 310 may, in certain embodiments, manage and/or control a plurality of different user interfaces 342, 344, such as for example different user interfaces 342, 344 provided at different assembly stages, or different user interfaces according to the type of worker accessing the system. For example, the user interface that is presented to the user may be different if the user is in accounting, versus a design team member, versus an assembly line worker. In another embodiment, a single computer system can host each of two or more of network server 320, user interface system 310, update/feedback system 365, mesh network system 330, and fabrication information system 325. Additional details regarding network server 320, user interface system 310, update/feedback system 365, mesh network system 330, and fabrication information system 325, are described herein.

In many embodiments, system 300 also can comprise electronic devices 340, 341, such as user computers, displays or personal electronic devices. For example, in one embodiment the electronic devices 340, 341 can comprise displays provided at different assembly stations at a volumetric module fabrication site. As another example, the electronic devices 340, 341 can comprise user computers accessed by designers, architects, or other persons involved in preparing the overall fabrication plan and/or instructions for assembly. In other embodiments, electronic devices 340, 341 are external to system 300. Electronic devices 340, 341 can comprise any of the elements described in relation to computer system 100. In some embodiments, electronic devices 340 can be mobile devices and/or voice activated electronic devices.

A mobile electronic device can refer to a portable electronic device (e.g., an electronic device easily conveyable by hand by a person of average size) with the capability to present audio and/or visual data (e.g., text, images, videos, music, etc.). For example, a mobile electronic device can comprise at least one of a digital media player, a cellular telephone (e.g., a smartphone), a personal digital assistant, a handheld digital computer device (e.g., a tablet personal computer device), a laptop computer device (e.g., a notebook computer device, a netbook computer device), a wearable user computer device, or another portable computer device with the capability to present audio and/or visual data (e.g., images, videos, music, etc.).

In many embodiments, system 300 can comprise user interfaces 342, 344, such as a graphical user interface ("GUI") and/or voice-activated user interface enabled by voice-activated software and/or on a voice-activated device, and/or a heads-up display. In the same or different embodiments, user interfaces 342, 344 can be part of and/or displayed by electronic devices 340, 341, which also can be part of system 300. In some embodiments, user interfaces 342, 344 can comprise text and/or graphics (image) based user interfaces and/or can comprise voice based user interfaces. In the same or different embodiments, user interfaces 342, 344 can comprise a heads up display ("HUD"). When user interfaces 342, 344 comprises a HUD, the user interfaces 342, 344 can be projected onto glass or plastic, displayed as a hologram, or displayed on monitor 106 (FIG. 1). In various embodiments, user interfaces 342, 344 can be color or black and white. In many embodiments, user interfaces 342, 344 can comprise an application running on a computer system, such as computer system 100, electronic devices 340, 341, and/or network server 320. In the same or different embodiments, user interfaces 342, 344 can comprise a website and/or portal accessed through network/internet 330. In the same or different embodiments, user interfaces 342, 344 can be displayed as or on a virtual reality (VR) and/or augmented reality (AR) system or display. In many embodiments, an interaction with a GUI can be received by system 300. In some embodiments, an interaction with a GUI can comprise a click, a look, a selection, a grab, a view, a purchase, a bid, a pinch, a reverse pinch, a swipe, etc.

In some embodiments, network server 320 can be in data communication through network 330 with electronic devices (e.g., 340, 341). In certain embodiments, the network 330 can comprise the internet, and/or the network 330 can comprise a closed or local network of connected computers. In certain embodiments, electronic devices 340, 341 can be desktop computers, laptop computers, smart phones, tablet devices, and/or other endpoint devices. Network server 320 can host one or more portals and/or websites. For example, network server 320 can host a website and/or homepage that allows users to access fabrication information for volumetric module assembly, to update items used to prepare the fabrication information, and/or to provide feedback on the fabrication information.

In many embodiments, network server 320, user interface system 310, mesh network system 330, update/feedback system 365 and fabrication information system 325 can each comprise one or more input devices (e.g., one or more keyboards, one or more keypads, one or more pointing devices such as a computer mouse or computer mice, one or more touchscreen displays, a microphone, etc.), and/or can each comprise one or more display devices (e.g., one or more monitors, one or more touch screen displays, projectors, etc.). In these or other embodiments, one or more of the input device(s) can be similar or identical to keyboard 104 (FIG. 1) and/or a mouse 110 (FIG. 1). Further, one or more of the display device(s) can be similar or identical to monitor 106 (FIG. 1) and/or screen 108 (FIG. 1). The input device(s) and the display device(s) can be coupled to the processing module(s) and/or the memory storage module(s) of network server 320, user interface system 310, mesh network system 330, update/feedback system 365 and fabrication information system 325 in a wired manner and/or a wireless manner, and the coupling can be direct and/or indirect, as well as locally and/or remotely. In a similar manner, the processing module(s) and the memory storage module(s) can be local and/or remote to each other.

Meanwhile, in many embodiments, network server 320, user interface system 310, mesh network system 330, update/feedback system 365 and fabrication information system 325 also can be configured to communicate with one or more databases. The one or more databases can comprise, for example, a database comprising any one or more of architectural, structural, mechanical, electrical and/or plumbing information for a volumetric module. For example, the system 300 can comprise a project document storage system 360 which can either comprise or be in communication with one or more databases storing project documents and/or project document information. The system 300 can also comprise a fabrication information storage 361 comprising one or more databases that store items of fabrication information for volumetric module assembly. The one or more databases can be stored on one or more memory storage modules (e.g., non-transitory memory storage module(s)), which can be similar or identical to the one or more memory storage module(s) (e.g., non-transitory memory storage module(s)) described above with respect to computer system 100 (FIG. 1). Also, in some embodiments, for any particular database of the one or more databases, that particular database can be stored on a single memory storage module of the memory storage module(s), and/or the non-transitory memory storage module(s) storing the one or more databases or the contents of that particular database can be spread across multiple ones of the memory storage module(s) and/or non-transitory memory storage module(s) storing the one or more databases, depending on the size of the particular database and/or the storage capacity of the memory storage module(s) and/or non-transitory memory storage module(s).

Meanwhile, communication between network server 320, user interface system 310 (which can control and/or manage a plurality of user interfaces according to user type, discipline, assembly line station, etc.), mesh network system 330, update/feedback system 365 and fabrication information system 325, and/or the one or more databases can be implemented using any suitable manner of wired and/or wireless communication. Accordingly, system 300 can comprise any software and/or hardware components configured to implement the wired and/or wireless communication. Further, the wired and/or wireless communication can be implemented using any one or any combination of wired and/or wireless communication network topologies (e.g., ring, line, tree, bus, mesh, star, daisy chain, hybrid, etc.) and/or protocols (e.g., personal area network (PAN) protocol(s), local area network (LAN) protocol(s), wide area network (WAN) protocol(s), cellular network protocol(s), powerline network protocol(s), etc.).

In many embodiments, the techniques described herein can provide a practical application and several technological improvements. In some embodiments, the techniques described herein can provide for improved coordination and implementation of assembly of volumetric modules, by providing a dynamically updatable system to instruct users on volumetric module assembly in real time, and to provide information via use of a mesh network that relates the information most pertinent to any given role and/or stage of assembly to other relevant information. These techniques described herein can also provide a significant improvement over conventional "static" instructional approaches that may require a user to undergo a lengthy process to individually and separately identify relevant assembly information from project documentation, and may require an operator to individually update each piece of assembly fabrication information whenever changes or improvement are made.

Turning ahead in the drawings, FIG. 4 illustrates a flow chart for a method 400, according to an embodiment. Method 400 is merely exemplary and is not limited to the embodiments presented herein. Method 400 can be employed in many different embodiments or examples not specifically depicted or described herein. In some embodiments, the activities of method 400 can be performed in the order presented. In other embodiments, the activities of method 400 can be performed in any suitable order. In still other embodiments, one or more of the activities of method 400 can be combined or skipped. In many embodiments, system 300 (FIG. 3) can be suitable to perform method 400 and/or one or more of the activities of method 400. In these or other embodiments, one or more of the activities of method 400 can be implemented as one or more computer instructions configured to run at one or more processing modules and configured to be stored at one or more non-transitory memory storage modules. Such non-transitory memory storage modules can be part of a computer system such as network server 320 (FIG. 3), user interface system 310 (FIG. 3), mesh network system 330 (FIG. 3), update/feedback system 365 (FIG. 3) and fabrication information system 25 (FIG. 3). The processing module(s) can be similar or identical to the processing module(s) described above with respect to computer system 100 (FIG. 1).

In many embodiments, method 400 (FIG. 4) can comprise an activity 401 of receiving project documents related to fabrication of a volumetric module. The project documents may, according to certain embodiments, be general information related to the components, structures and/or stages needed for assembly of the volumetric assembly and/or a building structure incorporating the volumetric assembly. Generally, according to certain embodiments, the project documents can comprise "plan" information indicating the properties, parameters, and elements of the final volumetric module build, along with other information. For example, the project documents can provide information on the overall dimensions and shape of components of the volumetric modules, and the elements (structural, mechanical, electrical plumbing, etc.) that are incorporated into the volumetric module. In one embodiment, the project documents can comprise any one or more of design data, drawings, building information modeling (BIM) data, project specifications, vendor data, installation instructions, and part make and model information, among other items of project documents.

According to one embodiment, the project documents can comprise architectural BIM information, such as a plan for the volumetric module and/or final building structure, as prepared by an architect. According to yet another embodiment, the project documents can comprise structural BIM information, such as information on the specific structures to be incorporated into the volumetric module, based on the structural plan. According to yet another embodiment, the project documents can comprise mechanical, electrical and plumbing (MEP) BIM information, such as information on the type and location of components of these systems, based on one or more of the architectural BIM, MEP BIM information, fire protection BIM information, and/or structural BIM information. According to yet another embodiment, the project documents can comprise design information and/or other project specifications that indicate further details for implementation of the architectural, structural, and/or MEP information.

According to yet another embodiment, the project documents can comprise any of fire protection information, acoustical information, and/or finishing information. According to yet further embodiments, the project documents can further comprise information on the make and model of components to be used and/or installed in the volumetric module, and/or vendor information for sourcing and purchasing the components. According to yet further embodiments, the project documents can comprise installation instructions for certain components.

According to certain embodiments, the project documents may be received from project document system 360, which can comprise one or more databases storing the project documents and/or project document information, and/or the system 360 can comprise a network connecting to one or more users 350, 351 having the project documents. For example, the project documents may be received from a plurality of users such as one or more architects, builders, designers, among others, such as on a dynamic basis, and/or as retrieved from a database or other storage.

In certain embodiments, the method 400 (FIG. 4) can continue by comprising an activity 402 (FIG. 4) of generating fabrication information, in relation to the received project documents, for instructing users on fabrication of the volumetric module. That is, according to certain embodiments, the received project documents are used to generate a plurality of items of fabrication information to assist and instruct one or more users on assembly of a portion and/or component of the volumetric module. In certain embodiments, the project documents that may be received from a plurality of sources, such as architectural, structural, and MEP BIM information, can be related to one another, to prepare fabrication information that combines and coordinates the project documents to provide unified instructions for all components and parts of the volumetric module. The generation of the fabrication information can also involve determining a sequence of assembly for the various different parts and/or components of the volumetric assembly, based on the project documents For example, the generation of the fabrication information can, in certain embodiments, comprise relating the different items of project documents to determine a sequence of, e.g., electrical installation with respect to structural installation or plumbing installation in the same or different regions of the volumetric module. Referring to FIG. 3, in one embodiment the fabrication information can be generated by a fabrication information system 325 that is in communication with and receives information from project document system 360.

According to one embodiment, the fabrication information can comprise any one or more of fabrication drawings, material information, fabrication sequence instructions, quality assurance and/or quality control processes, scheduling data and/or other information that can be of assistance in instructing how to carry out assembly of the volumetric module. In certain embodiments, the fabrication information can comprise more highly detailed and/or specific information that provides information to instruct on implementing the project described in the more high-level project documents. According to yet another embodiment, the fabrication information can be generated in multiple different data formats that are accessible by a user 350, 351. The multiple different data formats can comprise, for example, any formats that enhance the user's comprehension of the items of fabrication information. For example, the multiple different data formats can comprise any one or more of 3D models of the volumetric module and/or parts of the volumetric module, 2D models of the volumetric module and/or parts of the volumetric module, material data for the volumetric module and/or parts of the volumetric module, video data, text data, and searchable meta data. For example, in certain embodiments, an item of fabrication information can comprise a video that shows installation instructions for a part. According to yet another embodiment, an item of fabrication information may depict a 2D section view showing dimensions and/or arrangement of components and/or structures in a volumetric module. In yet another embodiment, an item of fabrication information can comprise text or audio instructions for assembly. In yet a further embodiment, an item of fabrication information can include quantities of parts needed, model numbers, and contact information for supplies and vendors of the parts. According to yet another embodiment, the fabrication information can further comprise architectural plans and other information received as a part of the project documents, for reference in carrying out assembly of the volumetric module.

In certain embodiments, the method 400 (FIG. 4) can continue by comprising an activity 403 (FIG. 4) of storing the fabrication information comprising the multiple different data formats for access by users 350, 351 in instructing fabrication of the volumetric module. According to one embodiment, the fabrication information can be stored in the fabrication information storage 361 (FIG. 3), such as by communication of the fabrication information system 325 with the fabrication information storage 361. According to certain embodiments, the fabrication information storage 361 can comprise a plurality of storage databases, and/or may be capable of storing a plurality of items of information in the multiple different formats. According to certain aspects, the fabrication information storage 361 may be accessible directly and/or indirectly by a plurality of users 350, 351, and/or the information may be used by the user interface system 310 to provide an intuitive user interface for accessing the fabrication information.

In certain embodiments, the method 400 (FIG. 4) can continue by comprising an activity 404 (FIG. 4) of creating a mesh network of actionable links based on parametric relationships among the items of fabrication information. According to certain embodiments, the mesh network of actionable links can comprise an intuitive, navigable mapping for access by a user 350, 351 of the stored fabrication information. In certain aspects, the mesh network based on the parametric relationships is created by associating a plurality of items of fabrication information with each other, based on one or more parameters that are shared by the plurality of items of fabrication information. The parameters may be, for example, a shared material (e.g. type of ceramic or wood), a shared type of work (e.g., plumbing, electrical), a shared structure (e.g. sink or window), a shared type of room, a shared stage of assembly, and other different types of shared parameters. Examples of parametric information can further include shared vendor data, shared project contract administration data (e.g. RFIs and submittals), and/or shared dimensional or location data. The shared parameters may be identified manually, and/or based on metadata associated with the items of fabrication information. The mesh network can relate and connect different items of fabrication information to each other that have relevance to one another, such that items pertaining to a certain assembly stage, components or part can be associated with one another. In one embodiment, the mesh network system 330 (FIG. 3) receives the items of fabrication information via the fabrication information system 325, and prepares the mesh network to interrelate relevant items of information to one another. In certain embodiments, items of fabrication information can be associated with one or more other items of fabrication information based on only one, or based on a plurality, of different parametric relationships. For example an instructional item of information regarding installation of a sink may be related to other items of fabrication information regarding plumbing, based on a shared plumbing parameter, may be related to other items of fabrication information regarding a kitchen based on a shared location parameter and/or may be related to other items of fabrication information regarding sink basin sink mounting materials, based on a shared materials parameter.

According to certain embodiments, the creation of the mesh network further comprises the creation of actionable links based on the parametric relationships, to provide an intuitive navigable mapping for accessing the stored fabrication information. The actionable links can comprise, for example, hyperlinks or other links that allow a user 350, 351 to navigate from one item of fabrication information to other items of fabrication information that are connected together via the mesh network. For example, the actionable links can allow a user to navigate among items of fabrication information that all relate to installation of a fixture, based on a shared fixture parameter. The actionable links can also allow a user to navigate among items of fabrication information according to a type of work to be performed, such as plumbing, electrical, structural, etc., in relation to a shared parametric relationship thereof. The actionable links can, for example, allow a user to navigate to certain items of information, and/or webpages or portals linked to items of information, that provide one or more further actionable links to other items of information that share the parametric relationship, such that the user is able to navigate among those items sharing the parametric relationship. The items of fabrication information, webpages and/or portals containing the actionable links may also comprise actionable links relating items of information to further items based on a plurality of different shared parametric relationships, such that an item of information that is linked to based on one shared parametric relationship may further comprise one or more actionable links to items of information, web pages, portals, etc., that are linked to based on a different parametric relationships. One of the advantages of the mesh network of actionable links based on parametric relationships, in certain embodiments, is that ease of maintenance of the system. In certain aspects, the parametric relationships can serve as the "connecting tissue" between different items of information, such that modifying or updating the output viewed by the end user on the user interface can be managed quickly and relatively easily, and with less risk of errors—for example by updating metadata and/or a parameter, rather than revising whole segments of the system and/or project information.

According to one embodiment, the intuitive navigable mapping for accessing the stored fabrication information by the actionable links via the mesh network is based on any one or more of (1) a stage of fabrication of the volumetric module, (2) a type of fabrication work to be performed, and (3) a type of user accessing the fabrication information. For example, in certain aspects, the intuitive navigable mapping is created by prioritizing for display those actionable links that are most pertinent to the particular user 350, 351 accessing the fabrication information. For example, for a user at an early stage of fabrication, and who is charged with performing plumbing installation, the intuitive navigable mapping will display actionable links to access the mesh network that are most relevant to the type of work to be performed (e.g., plumbing), and to the very early stage of fabrication (e.g., initial plumbing installation steps, as opposed to final stages). The user seeking to access information on plumbing installation can further navigate the actionable links through the mesh network to obtain further installation instructions and/or related information.

In one embodiment, the intuitive navigable mapping can be created by identifying shared parametric relationships among the items of fabrication information, and the stage of assembly and type of assembly to be performed. According to another embodiment, the intuitive navigable mapping can be created by identifying those items of information related to each type of work, each type of user, and each stage of fabrication, and selectively presenting pre-determined actionable links that serve as "access points" to the mesh network based on this predetermined information. For example, for a user seeking to access the fabrication information, who indicates they are interested in information regarding plumbing installation at an early assembly stage, the intuitive navigable mapping may identify actionable links that have been predetermined as access points to the mesh network that are suitable for that early stage of plumbing installation.

According to yet another embodiment, the user may enter identifying information that allows the system to identify a type of work that the person is assigned to performs, and identify a current stage of assembly for that type of work, and determine the appropriate actionable link to serve as the access point to the mesh network for that stage of assembly and type of work. For example, the actionable link serving as the access point may link directly or indirectly to information relevant to the current stage of assembly, and/or parts and components required for the current stage of assembly of those parts. According to yet further embodiments, the linking of nodes (items of information) in the mesh network may be dynamically re-assigned according to any of the stage of fabrication, type of fabrication work and/or type of user, so that the user is able to efficiently navigate along the mesh network to the items of information that are most pertinent to that user. That is, according to certain embodiments, the intuitive navigable mapping may be capable of prioritizing access to those items of information that are most relevant to a user, based on the type of work to be performed and the stage of assembly, such that the user receives the information that is most pertinent to them, substantially without having to review less relevant information.

According to certain embodiments, the intuitive navigable mapping may be capable of providing actionable links that guide the user to information that it may be prudent for the user to be aware of, but that they might not otherwise seek in the absence of such an intuitive mapping. For example, based on the shared parametric relationships, the intuitive mapping may be capable of providing actionable links that guide a user with respect to other aspects of installation beyond the scope of their own work, so they can assess how other assembly jobs could impact their intended work. For example, the intuitive mapping may be capable of providing actionable links that provide information on installation of electrical structures in a region where plumbing installation will occur, so the user can understand how to sequence the two types of installations and how they interrelate, and/or so the user can determine how to structure their work in relation to other ongoing work on the volumetric module.

In certain embodiments, the method 400 (FIG. 4) can continue by comprising an activity 405 (FIG. 4) of providing a user interface (and/or a collection of different interfaces 342, 244) accessible by any one or more of a plurality of users to interact with the intuitive, navigable mapping to perform any one or more of (i) accessing the fabrication information to perform one or more steps in the fabrication of the volumetric module, and (ii) providing feedback regarding the fabrication information to facilitate review and updating to the fabrication information. For example, referring to FIG. 3, according to certain embodiments the user interface system 310 can provide the user interfaces 342, 344 to the electronic devices 340, 341 accessed by users 350, 351. According to certain embodiments, the user interface provides a display of the actionable links, with the actionable links being displayed in accordance with the intuitive navigable mapping. For example, according to one embodiment, the user interface can provide an intuitive, navigable mapping by selectively displaying that subset of the actionable links of the mesh network that are of highest priority to the user. That is, the user interface can provide a display of actionable links that are selected based on any one or more of (1) a stage of fabrication of the volumetric module, (2) a type of fabrication work to be performed, and (3) a type of user accessing the fabrication information. In one embodiment, the subset of actionable links may serve as "access points" to the mesh network, which the user can navigate to find further linked information relevant to assembly. In another embodiment, the user inputs information in relation to any or more of (1)-(3) to activate the user interface to display the set of actionable links that are relevant to the user.

According to one embodiment, the user interface is accessible by one or more of a plurality of users to provide access to the items of fabrication information to guide in performing one or more steps in the fabrication of the volumetric module. For example, a user tasked with performing a certain type of fabrication work can access the user interface, and the intuitive navigable mapping provided through the user interface, to locate information relevant to that work. In one embodiment, a type of fabrication work that may be performed, and that a user may seek information with respect to, can be any one or more of framing, structural, fire protection, acoustical, mechanical, electrical and plumbing, and finishing work. By accessing the interface and using the intuitive navigable mapping, the user can navigate through the actionable links associated with relevant items of fabrication information, to obtain instructions for guiding the work. According to certain embodiments, a type of user accessing the fabrication information via the user interface can comprise any one or more of a user at a predetermined assembly station in an assembly line, and a user performing a predetermined type of fabrication work (e.g. plumbing, electrical structural, etc.). According to further embodiments, a type of user accessing the fabrication information may be an architect and/or designer or other person involved in preparation of the project documents, for example to review, receive feedback on, and/or troubleshoot the fabrication information generated using the project documents.

According to yet another embodiment, the user interface provides a display of the intuitive, navigable mapping by displaying at least a portion of the actionable links such that they are overlaid on a 2D or 3D schematic representation of the volumetric module, contained within material elements, textual information, and at locations approximating a physical location of fabrication processes related to the fabrication information contained in each actionable link. For example, for fabrication information relevant to a kitchen area of a volumetric module, actionable links associated with such fabrication information can be overlaid on a 2D schematic representation of the volumetric module at a location in the 2D schematic representation corresponding to the physical location of the kitchen. According to certain embodiments, by displaying at least a portion of the actionable links as overlaid over a 2D schematic representation, a user may be able to more readily identify those actionable links that are relevant to the work to be performed, such as for example by identifying actionable links overlaid in a kitchen area of the 2D schematic representation as being relevant to fabrication of a portion thereof.

According to yet another embodiment, the user interface is accessible by any one or more of a plurality of users to provide feedback regarding the fabrication information, for example to facilitate review and updating of the fabrication information. For example, in the event a user encounters an error in an item of fabrication information, the user can access the user interface and interact with the intuitive navigable mapping to flag or comment on an item of fabrication information, and provide a notification to an operator of the system regarding the feedback. According to one embodiment, where a 2D schematic of the volumetric module is used to display actionable links in locations corresponding to the physical locations of the components for which fabrication information is linked to, the user interface can allow a user to interact to provide feedback and comments at relevant locations on the 2D schematic. By providing feedback at locations of the 2D schematic that correspond to the physical location of a component and/or structure that is being assembled, an operator of the system may be able to readily identify the part of the volumetric module where feedback was provided by the user, and/or can readily identify where issues exist for improvement and updating of the fabrication information. For example, in a case where the user flags a kitchen portion of the 2D schematic, the operator can readily identify that an issue exists with respect to the fabrication information for the kitchen portion of the volumetric module, and can take appropriate action to investigate and improve. According to other embodiments, the user can access the user interface to provide feedback regarding the fabrication information via alternative processes, such as by marking up the fabrication information, attaching view or photos demonstrating issues with the fabrication information, or otherwise providing comments on the fabrication information in a manner that is accessible to operators and/or others that provide information used in the fabrication information, such as designers and/or architects.

In certain embodiments, the method 400 (FIG. 4) can continue by comprising an activity 406 (FIG. 4) of continuously updating the stored fabrication information and mesh network based on any one or more of (i) newly received or updated project documents and/or fabrication information, and (ii) feedback received by one or more users regarding the fabrication information. For example, referring to FIG. 3, the update/feedback system 365 can be in communication with any one or more of the user interface system 310, mesh network system 330 and fabrication information system 325, to provide updates on a dynamic basis. In one embodiment, the fabrication information stored in the fabrication information storage 361 is updated in response to receiving new project documents, or new fabrication information. For example, in the event a design change is made to the volumetric module, the fabrication information can be updated to reflect this change. As yet another example, the mesh network can be updated to provide a different linking architecture between different items of information when a new parameter shared by items of information is identified, or when new fabrication information is created, as well as when existing fabrication information is updated. As another example, the linking between nodes (items of fabrication information) can be updated to prioritize certain items of information in response to a type of user accessing the fabrication information and/or a type of work to be performed. According to yet another embodiment, the fabrication information and/or mesh network can be updated in response to feedback received by one or more users. For example, the items of fabrication information can be updated and/or corrected where deficiencies are noted, and/or different items of fabrication information can be linked together based on a recommendation of a user. The dynamic updating of the items of fabrication information and mesh network relating the items of fabrication information can allow for continuous improvement and enhanced efficiency in the methods and systems for assembly.

Figure 5:
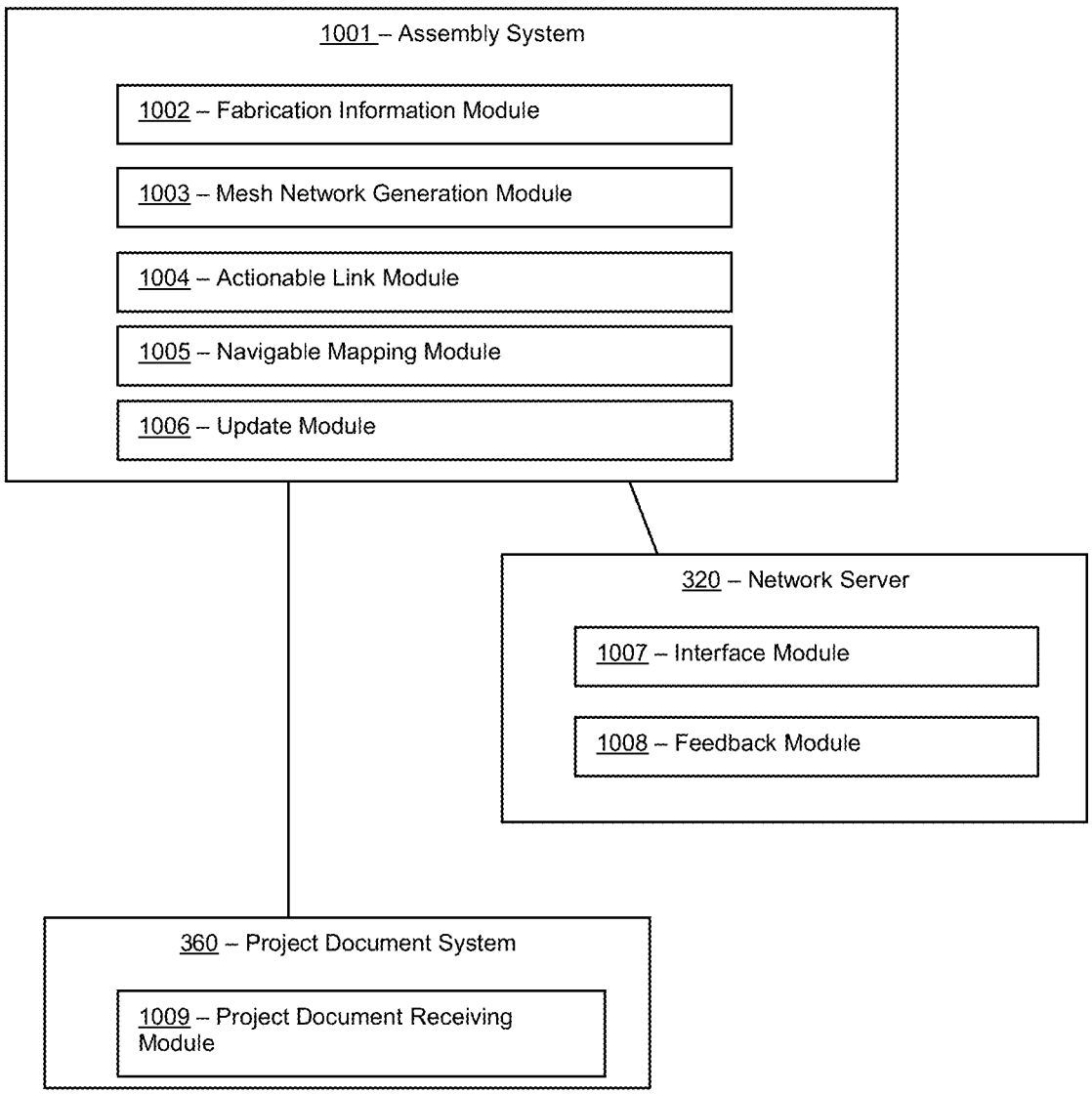
FIG. 5 illustrates a representative block diagram of a system, according to an embodiment.

Turning ahead in the drawings, FIG. 5 illustrates a block diagram of the system 300 that can be employed for the method herein. System 300 is merely exemplary and embodiments of the system are not limited to the embodiments presented herein. System 300 can be employed in many different embodiments or examples not specifically depicted or described herein. In some embodiments, certain elements or modules of system 300 can perform various procedures, processes, and/or activities. In these or other embodiments, the procedures, processes, and/or activities can be performed by other suitable elements or modules of system 300.

Generally, therefore, system 300 can be implemented with hardware and/or software, as described herein. In some embodiments, part or all of the hardware and/or software can be conventional, while in these or other embodiments, part or all of the hardware and/or software can be customized (e.g., optimized) for implementing part or all of the functionality of system 300 described herein.

In many embodiments, system 300 can comprise non-transitory memory storage module 1001. Memory storage module 1001 can be referred to as Assembly System Module 1001. In many embodiments, Assembly System Module 1001 can store computing instructions configured to run on one or more processing modules and perform one or more acts of method 400 (FIG. 4) (e.g., activities 402-406 (FIG. 4)).

In many embodiments, system 300 can comprise non-transitory memory storage module 1002. Memory storage module 1002 can be referred to as Fabrication Information Module 1002. In many embodiments, Fabrication Information Module can store computing instructions configured to run on one or more processing modules and perform one or more acts of method 400 (FIG. 4) (e.g., activities 402-403).

In many embodiments, system 300 can comprise non-transitory memory storage module 1003. Memory storage module 1003 can be referred to as Mesh Network Generation Module 1003. In many embodiments, Mesh Network Generation can store computing instructions configured to run on one or more processing modules and perform one or more acts of method 400 (FIG. 4) (e.g., activity 404).

In many embodiments, system 300 can comprise non-transitory memory storage module 1004. Memory storage module 1004 can be referred to as Actionable Link Module 1004. In many embodiments, Actionable Link 1004 can store computing instructions configured to run on one or more processing modules and perform one or more acts of method 400 (FIG. 4) (e.g., activity 404).

In many embodiments, system 300 can comprise non-transitory memory storage module 1005, for example as a part of the web server 320. Memory storage module 1005 can be referred to as Navigable Mapping Module 1005. In many embodiments, Navigable Mapping Module 1005 can store computing instructions configured to run on one or more processing modules and perform one or more acts of method 400 (FIG. 4) (e.g., activity 404).

In many embodiments, system 300 can comprise non-transitory memory storage module 1006. Memory storage module 1006 can be referred to as Update Module 1006. In many embodiments, Update Module can store computing instructions configured to run on one or more processing modules and perform one or more acts of method 400 (FIG. 4) (e.g., activity 406).

In many embodiments, system 300 can comprise non-transitory memory storage module 320. Memory storage module 320 can be referred to as Network Server Module 320. In many embodiments, Network Server Module can store computing instructions configured to run on one or more processing modules and perform one or more acts of method 400 (FIG. 4) (e.g., activity 405).

In many embodiments, system 300 can comprise non-transitory memory storage module 1007. Memory storage module 1007 can be referred to as Interface Module 1007. In many embodiments, Interface Module can store computing instructions configured to run on one or more processing modules and perform one or more acts of method 400 (FIG. 4) (e.g., activity 405).

In many embodiments, system 300 can comprise non-transitory memory storage module 360. Memory storage module 360 can be referred to as Project Document System Module 360. In many embodiments, Project Document System Module can store computing instructions configured to run on one or more processing modules and perform one or more acts of method 400 (FIG. 4) (e.g., activity 401).

In many embodiments, system 300 can comprise non-transitory memory storage module 1009. Memory storage module 1009 can be referred to as Project Document Receiving Module 1009. In many embodiments, Project Document Receiving Module can store computing instructions configured to run on one or more processing modules and perform one or more acts of method 400 (FIG. 4) (e.g., activity 401).

Although systems and methods for providing instructions for the assembly of volumetric modules have been described with reference to specific embodiments, it will be understood by those skilled in the art that various changes may be made without departing from the spirit or scope of the disclosure. Accordingly, the disclosure of embodiments is intended to be illustrative of the scope of the disclosure and is not intended to be limiting. It is intended that the scope of the disclosure shall be limited only to the extent required by the appended claims. For example, to one of ordinary skill in the art, it will be readily apparent that any element of FIGS. 1-7 may be modified, and that the foregoing discussion of certain of these embodiments does not necessarily represent a complete description of all possible embodiments. For example, one or more of the procedures, processes, or activities of FIG. 4 may include different procedures, processes, and/or activities and be performed by many different modules, in many different sequences.

All elements claimed in any particular claim are essential to the embodiment claimed in that particular claim. Consequently, replacement of one or more claimed elements constitutes reconstruction and not repair. Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims, unless such benefits, advantages, solutions, or elements are stated in such claim.

Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

What is claimed is:

1. A system comprising:
    a plurality of processors; and
    one or more non-transitory computer-readable media storing computing instructions configured to run on the plurality processors and perform:
    (a) receiving project documents related to fabrication of a volumetric module, the project documents comprising one or more of design data, drawings, building information modeling (BIM) data, project specifications, vendor data, installation instructions, and component make and model information;
    (b) generating fabrication information, in relation to the received project documents, for instructing users on fabrication of the volumetric module, the fabrication information comprising one or more of fabrication drawings, material information, fabrication sequence instructions, quality assurance and/or quality control processes, and scheduling data, the fabrication information comprising multiple different data formats;
    (c) storing the fabrication information comprising the multiple different data formats for access in instructing fabrication of the volumetric module;
    (d) creating a mesh network of actionable links based on parametric relationships comprising an intuitive, navigable mapping for accessing the stored fabrication information, the intuitive mapping being based on any one or more of (1) a stage of fabrication of the volumetric module, (2) a type of fabrication work to be performed, and (3) a type of user accessing the fabrication information;
    (e) providing a user interface accessible by any one or more of a plurality of users to interact with the intuitive, navigable mapping to perform any one or more of (i) accessing the fabrication information to perform one or more steps in the fabrication of the volumetric module, and (ii) providing feedback regarding the fabrication information to facilitate review and updating to the fabrication information; and
    (f) continuously updating the stored fabrication information and mesh network based on any one or more of (i) newly received or updated project documents and/or fabrication information, and (ii) feedback received by one or more users regarding the fabrication information.

2. The system according to claim 1, wherein the project documents comprise any of architectural information, structural information, and mechanical, electrical and plumbing information (MEP information), fire protection information, and acoustical information relating to the fabrication of the volumetric module.

3. The system according claim 1, wherein the multiple different data formats of the fabrication information comprise any one or more of 3D models of the volumetric module and/or parts of the volumetric module, 2D models of the volumetric module and/or parts of the volumetric module, material data for the volumetric module and/or parts of the volumetric module, video data, text data, and searchable meta data.

4. The system according to claim 1, wherein the type of fabrication work to be performed includes any one or more of framing, structural, fire protection, acoustical, mechanical, electrical and plumbing, and finishing work.

5. The system according claim 1, wherein the type of user accessing the fabrication information can comprise any one or more of a user at a predetermined assembly station in an assembly line, and a user performing a predetermined type of fabrication work.

6. The system according to claim 1, wherein the user interface provides the intuitive, navigable mapping by selectively displaying a subset of the actionable links of the mesh network to the user, in relation to any of the items (1)-(3) in (d).

7. The system according to claim 1, wherein a user inputs information in relation to any of items (1)-(3) in (d) to activate the user interface to display a set of actionable links that are relevant to the user.

8. The system according to claim 1, wherein at least a portion of the actionable links are overlaid on a 2D schematic representation of the volumetric module, at locations approximating a physical location of fabrication processes related to informational instructions contained in each actionable link.

9. The system according to claim 1, wherein creating the mesh network of actionable links based on parametric relationships comprises associating a plurality of items of fabrication information with each other, based on one or more parameters that are shared by the plurality of items of fabrication information.

10. A method implemented via execution of computing instructions configured to run at one or more processors and configured to be stored at non-transitory computer-readable media, the method comprising:
 (a) receiving project documents related to fabrication of a volumetric module, the project documents comprising one or more of design data, drawings, building information modeling (BIM) data, project specifications, vendor data, installation instructions, and part make and model information;
 (b) generating fabrication information, in relation to the received project documents, for instructing users on fabrication of the volumetric module, the fabrication information comprising one or more of fabrication drawings, material information, fabrication sequence instructions, quality assurance and/or quality control processes, and scheduling data, the fabrication information comprising multiple different data formats;
 (c) storing the fabrication information comprising the multiple different data formats for access in instructing fabrication of the volumetric module;
 (d) creating a mesh network of actionable links based on parametric relationships comprising an intuitive, navigable mapping for accessing the stored fabrication information, the intuitive mapping being based on any one or more of (1) a stage of fabrication of the volumetric module, (2) a type of fabrication work to be performed, and (3) a type of user accessing the fabrication information;
 (e) providing a user interface accessible by any one or more of a plurality of users to interact with the intuitive, navigable mapping to perform any one or more of (i) accessing the fabrication information to perform one or more steps in the fabrication of the volumetric module, and (ii) providing feedback regarding the fabrication information to facilitate review and updating to the fabrication information; and
 (f) continuously updating the stored fabrication information and mesh network based on any one or more of (i) newly received or updated project documents and/or fabrication information, and (ii) feedback received by one or more users regarding the fabrication information.

11. The method according to claim 10, wherein the project documents comprise any of architectural information, structural information, and mechanical, electrical and plumbing information (MEP information), fire protection information, and acoustical information relating to the fabrication of the volumetric module.

12. The method according to claim 10, wherein the multiple different data formats of the fabrication information comprise any one or more of 3D models of the volumetric module and/or parts of the volumetric module, 2D models of the volumetric module and/or parts of the volumetric module, material data for the volumetric module and/or parts of the volumetric module, video data, text data, and searchable meta data.

13. The method according to claim 10, wherein the type of fabrication work to be performed includes any one or more of framing, structural, fire protection, acoustical, mechanical, electrical and plumbing, and finishing work.

14. The method according to claim 10, wherein the type of user accessing the fabrication information can comprise any one or more of a user at a predetermined assembly station in an assembly line, and a user performing a predetermined type of fabrication work.

15. The method according to claim 10, wherein the user interface provides the intuitive, navigable mapping by selectively displaying a subset of the actionable links of the mesh network to the user, in relation to any of the items (1)-(3) in (d).

16. The method according to claim 10, wherein the user inputs information in relation to any of items (1)-(3) in (d) to activate the user interface to display a set of actionable links that are relevant to the user.

17. The method according to claim 10, wherein at least a portion of the actionable links are overlaid on a 2D schematic representation of the volumetric module, at locations approximating a physical location of fabrication processes related to informational instructions contained in each actionable link.

18. The method according to claim 10, wherein creating the mesh network of actionable links based on parametric relationships comprises associating a plurality of items of fabrication information with each other, based on one or more parameters that are shared by the plurality of items of fabrication information.

* * * * *